(12) United States Patent
Pruvost

(10) Patent No.: US 8,963,629 B2
(45) Date of Patent: Feb. 24, 2015

(54) VARIABLE ADMITTANCE CIRCUIT

(71) Applicant: NXP B.V., Eindhoven (NL)

(72) Inventor: Xavier Pruvost, Bretteville l'Orgueilleuse (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/195,710

(22) Filed: Mar. 3, 2014

(65) Prior Publication Data

US 2014/0312965 A1 Oct. 23, 2014

(30) Foreign Application Priority Data

Mar. 6, 2013 (EP) .................................... 13290044

(51) Int. Cl.
| | | |
|---|---|---|
| *H03B 1/00* | (2006.01) | |
| *H03K 5/00* | (2006.01) | |
| *H04B 1/10* | (2006.01) | |
| *H03H 11/28* | (2006.01) | |
| *H03J 1/00* | (2006.01) | |

(52) U.S. Cl.
CPC .............. *H03H 11/28* (2013.01); *H03J 1/0008* (2013.01); *H03J 2200/10* (2013.01); *H03J 2200/15* (2013.01)
USPC ............ 327/553; 327/552; 327/558; 327/559

(58) Field of Classification Search
USPC ........ 327/552, 553, 558; 331/15–17; 341/120
See application file for complete search history.

(56) References Cited

U.S. PATENT DOCUMENTS

| | | | |
|---|---|---|---|
| 6,181,215 B1 | 1/2001 | Kuttner | |
| 6,366,161 B1* | 4/2002 | Koazechi | 327/553 |
| 6,563,390 B1 | 5/2003 | Kizziar | |
| 7,050,781 B2 | 5/2006 | Khalil et al. | |
| 7,098,738 B2 | 8/2006 | Tam et al. | |
| 2002/0186074 A1* | 12/2002 | Gorecki et al. | 327/554 |
| 2003/0206070 A1 | 11/2003 | Pietruszynski et al. | |
| 2005/0118990 A1* | 6/2005 | Stephens | 455/418 |
| 2007/0236281 A1 | 10/2007 | Cicalini | |
| 2008/0100374 A1* | 5/2008 | Papananos et al. | 327/553 |
| 2011/0148530 A1 | 6/2011 | Geltinger et al. | |
| 2012/0025904 A1* | 2/2012 | Fogleman | 327/554 |

FOREIGN PATENT DOCUMENTS

EP 2 302 791 A1 3/2011

OTHER PUBLICATIONS

Extended European Search Report for EP Patent Appln. No. 13290044.0 (Aug. 13, 2013).

* cited by examiner

*Primary Examiner* — Brandon S Cole

(57) ABSTRACT

A programmable variable admittance circuit may be used in a programmable filter or a variable gain amplifier in a number of different applications including tuners and other RF receiver circuits. A variable admittance circuit and operation is described including a number of switchable admittance elements arranged in parallel branches. The variable admittance circuit requires fewer transitions to change between successive admittance values than a binary weighted circuit and fewer branches for implementation then a thermometry admittance circuit.

14 Claims, 4 Drawing Sheets

VARIABLE ADMITTANCE CIRCUIT

CROSS-REFERENCE TO RELATED APPLICATIONS

This application claims the priority under 35 U.S.C. §119 of European patent application no. 13290044.0, filed on Mar. 6, 2013, the contents of which are incorporated by reference herein.

The invention relates to a variable admittance circuit for programmable filters or programmable gain amplifiers.

Variable admittance circuits for programmable admittance circuits which can be incremented step-wise are used in filters which may be for example included in radio-frequency (RF) circuits such as tuners for receiving television signals. These variable admittance structures can change the admittance in fine steps. Typically these admittance structures will comprise a number of elementary admittance elements arranged in parallel which can be switched in and out of the circuit to alter the admittance value. This can be used to make any variable passive element i.e. a resistance, capacitance, inductance. The term admittance as used herein should be understood as being the reciprocal of the circuit impedance.

In variable admittance circuits such as that, described in U.S. Pat. No. 7,050,781, the admittance values are typically binary weighted. The value of each admittance is chosen such that the variable admittance circuit can be controlled with a binary code sequence. A binary weighted sequence gives the minimum number of branches in the variable admittance circuit for a targeted dynamic range. However, when changing from one admittance value to another admittance value, many of the switchable admittance elements may be switched in a single transition. This has two consequences. Firstly the cumulative tolerances of the admittance elements may compromise the accuracy of certain step increases, since many of the elements in use may change certain admittance value and the next admittance value in the sequence, and there may be a considerable variation in tolerance between the elements used. Therefore the accuracy of the step increase may be compromised. To get an accurate step change between admittance values, or components in the variable admittance circuit will need to be carefully matched which requires a large area to implement the elements. Secondly during the transition of all the command bits, an unwanted command code may occur resulting in large glitches or transients which may disturb the operation of the circuit.

Various aspects of the invention are defined in the accompanying claims. In a first aspect there is defined a variable admittance circuit comprising a plurality of admittance elements arranged in parallel branches, the plurality of admittance elements comprising a fixed admittance element having an admittance value $Y_0$, a sequence of at least three switchable admittance elements having respective admittance values $Y_1$ in a geometric sequence with a common ratio r and first value $Y_1$ given by $$Y_1 = Y_{min} * \left(\frac{r-1}{r}\right) = Y_0 * (r-1)$$

wherein the variable admittance circuit is operable to vary the total admittance between a minimum admittance value $Y_{min}$ and a maximum admittance value $Y_{max}$ in steps by switching the switchable admittance elements thereby selecting or unselecting the switchable admittance elements and wherein the common ratio is less than two and greater than a maximum step, and the at least three switchable admittance elements comprise a first switchable admittance element (Y1) having an admittance value $Y_1$, a second switchable admittance element (Y2) having an admittance value $Y_2$; and a further switchable admittance element of rank i (Yi) having an admittance value of $K*(Y_1+Y_2)$, wherein K is a number in the range of 0.8 to 1.05.

The variable admittance circuit may form a programmable differential thermometric admittance circuit which reduces the number of branches compared to that required for a thermometric admittance circuit of equivalent maximum step size so reducing the required silicon area.

The relationship of admittance values for first, second and further switchable admittances gives a reduced number of branches for a given maximum step size compared to a thermometric admittance circuit. The step size is defined as the ratio between successive total admittance values of the differential thermometric circuit.

In embodiments for a branch I having a value greater than rank i, the admittance of admittance element $Y_I$ may be $K*(Y_{I-i+1}+Y_{I-i+2})$ and the variable admittance circuit may increase the total admittance by a value of $Y_I - Y_{I-1}$ by unselecting switchable admittance element $Y_{I-1}$, selecting switchable admittance element $Y_{I-i+1}$ and selecting switchable admittance element $Y_{I-i+2}$.

Embodiments of the variable admittance may further comprise a controller coupled to each of the switchable admittance elements, the controller configured to vary the total admittance between the minimum admittance value $Y_{min}$ and the maximum admittance value $Y_{max}$ by switching a maximum of three switchable admittance elements.

The control of the differential circuit may be arranged so that no more than three switchable elements are switched into or out of circuit between one admittance value and the next admittance value in the required sequence. This reduces switching noise between transitions and also minimizes the changes in admittance elements used to realise adjacent admittance values in the sequence, reducing the matching requirements and consequently the silicon area required.

In embodiments of the variable admittance circuit, the number of parallel branches may be greater than or equal to $2+\log(Y_{max}/Y_{min})/\log(r)$.

The above variable admittance circuit minimises the switching between each admittance step whilst ensuring that the number of branches required to implement such a circuit is of the same order as the equivalent binary weighted circuit. The maximum step value may be determined by the particular design but the steps between successive allowable admittance values may be variable.

The minimum number of possible branches for a given maximum step size may be determined by the desired minimum and maximum admittance values and the common ratio, since the common ratio value chosen determines the maximum step size.

In embodiments at least one of the admittance elements may include one or more of a capacitor, a resistor and an inductor.

In embodiments at least one of the admittance elements comprises a transistor with the admittance value being determined by the transconductance of the transistor.

In embodiments of the variable admittance circuit, the switch in the switchable admittance element may use a transistor such as an MOS transistor with the gate being controlled from a programmable register.

Embodiments of the variable admittance circuit may be incorporated into filters, programmable gain amplifiers, other RF tuner circuits and silicon tuners for receiving television signals.

In a second aspect there is described a method of altering the admittance of a variable admittance circuit, the variable admittance circuit comprising a plurality of admittance elements arranged in parallel branches, the plurality of admittance elements comprising a fixed admittance element (Y0) having an admittance value $Y_0$, a sequence of at least three switchable admittance elements (Y1, Y2 . . . Yn) having respective admittance values $Y_I$, the method comprising the steps for branches where I is greater than or equal to a predetermined ranking integer value i of selecting a branch with admittance value $Y_{I-1}$, increasing the total admittance by a value of less than $Y_{I+1} - Y_{I-1}$ by (1) for the case where branches having a value of $Y_{I-i+1}$ and $Y_{I-i+2}$ are unselected, unselecting switchable admittance element having a value $Y_{I-1}$, selecting switchable admittance element having a value $Y_{I-i+1}$ and selecting switchable admittance element having a value $Y_{I-i+2}$ and (2) for the case where branches having a value of $Y_{I-i+1}$ and $Y_{I-i+2}$ are already selected, unselecting switchable admittance element having a value $Y_{I-1}$ and selecting switchable admittance element having a value $Y_I$.

The method of operation allows two smaller admittance values to be used to increase the total admittance by a value nominally equal to the value of admittance $Y_I - Y_{I-1}$ and so minimizes the number of admittance elements switched into or out of circuit when stepwise increasing the total admittance of the circuit to three or fewer branches.

Embodiments of the invention are now described in detail, by way of example only, illustrated by the accompanying drawings in which.

Figure 1:
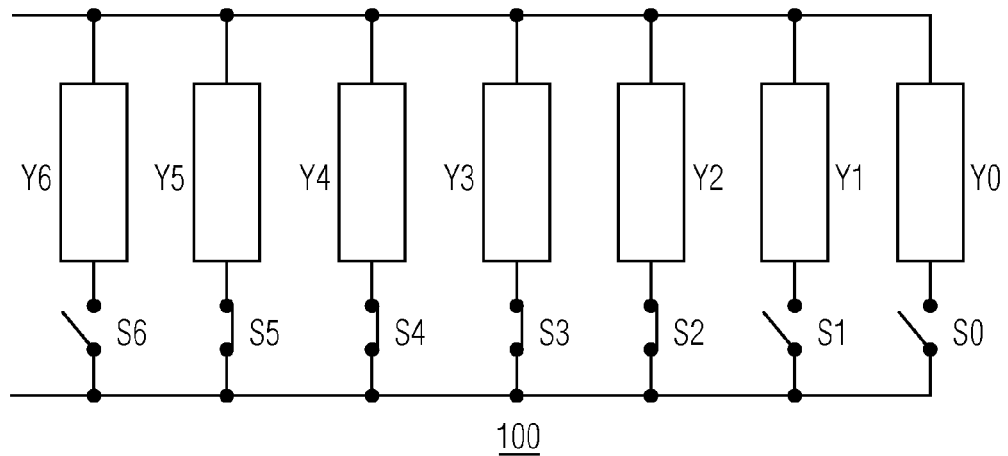
FIG. 1 shows a known variable binary weighted admittance circuit.

FIG. 1 shows a known admittance circuit 100. The admittance circuit consists of seven branches connected in parallel. A first branch consists of a series arrangement of an admittance element Y0 and a switch S0. The admittance element Y0 contributes to the admittance value of the admittance circuit 100 when the switch S0 is closed or switched on. The other six branches also consist of a series arrangement of an admittance element and a switch. In operation the total admittance value of admittance circuit 100 is the sum of the switched on branches. The switch may be implemented for example as an MOS transistor with the gate being controlled from a programmable register. The admittance element may be a capacitor. Admittance elements of successive parallel branches maybe denoted as Y1, Y2, Y3, Y4, Y5, and Y6 respectively. Switches of successive parallel branches are denoted as S1, S2, S3, S4, S5, and S6 respectively. The admittance value of each of the admittance elements is determined by a binary weighting scheme. To illustrate how the values may be chosen, assume a programmable variable admittance which can vary between a minimum value that can be programmed ($Y_{min}$) and a maximum value that can be programmed ($Y_{max}$) with a defined increment or step in admittance value between successive sequential admittance values which may be denoted as $Y_k$ and $Y_{k+1}$. The step may be considered as the ratio of sequential admittance values, so the step value will be $Y_{k+1}/Y_k$. This may be translated into a linear step value expressed in decibels when an admittance circuit is included into a programmable amplifier or filter circuit.

In general if $Y_I$ is the admittance of the Ith branch, then the value of each element in the circuit may be calculated by the following relationships.

$$Y0 = Y_{min}(Y_{k+1}/Y_k - 1)$$

$$Y_I = 2 * Y_{I-1}$$

For example for a programmable admittance between 1 S and 5 S which is required to increment by 0.05 S.

$$Y_{min} = 1 \text{ S}$$

$$Y_{max} = 5 \text{ S}$$

And for the binary weighted network $$Y_{k+1}/Y_k = 1.05$$

$$Y_0 = 1.05 - 1 = 0.05 \text{ S}$$

$$Y_1 = 2 * Y_0 = 0.1 \text{ S}$$

$$Y_2 = 2 * Y_1 = 0.2 \text{ S}$$

This results in values of admittance of Y0=0.05, Y1=0.1, Y2=0.2, Y3=0.4, Y4=0.8, Y5=1.6, Y6=3.2. Since the circuit is required to operate between 1 and 5 Siemens in increments of 0.05, the binary code required to program the circuit varies between 20 and 100. When code value 20 is selected corresponding to binary code 0010100 then admittance elements Y2 and Y4 in admittance circuit 100 are connected in parallel corresponding to an admittance value of 1 S. As shown in FIG. 1, the admittance circuit may be programmed with a code of 60 (binary 0111100). In this case the switches for the branches of admittance elements Y5, Y4, Y3, and Y2 may be closed corresponding to an admittance value of 3.0 S.

In admittance circuit 100 some code transitions cause a significant change of the admittance elements used to realize the admittance circuit. This means that accurate steps are difficult to realize at transition from code $2^{(n-1)}$ to $2^n$. For example in admittance element 100, transitions from code 1 to 2, 3 to 4, 7 to 8, 15 to 16, 63 to 64 result in a complete change of admittance elements in use. In admittance circuit 100. In the worst case programming a change of admittance value between 3.15 to 3.2 requires a code change from 63 to 64 (0111111 to 1000000) and all admittance elements in the admittance circuit 100 change. Therefore the components in the must be closely matched which may require a larger area requirement to implement.

Furthermore during transition of all command bits, an unwanted command code can occur which may result in large glitches or transients which may disturb the operation of the circuit, since all the transitions of the command bits may not be perfectly synchronous.

Figure 2:
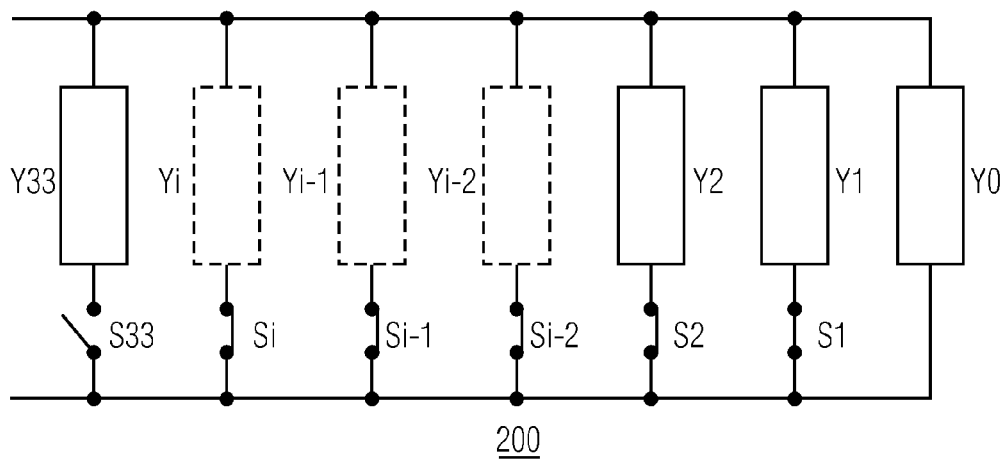
FIG. 2 Illustrates a known variable thermometric admittance circuit weighted using a geometric progression.

FIG. 2 shows known geometric or thermometric admittance circuit 200 with 34 branches connected in parallel. A first branch may have admittance element Y0 which always contributes to the total admittance of the admittance circuit

200. A second branch consists of a series arrangement of an admittance element Y1 and a switch S1. The admittance element Y1 contributes to the admittance value of the admittance circuit 200 when the switch S1 is closed or switched on. The remaining 32 branches may also consist of a series arrangement of an admittance element denoted Y2 to Y33 and a switch denoted S2 to S33 respectively. In operation the total admittance value of admittance circuit 200 is the sum of the switched on branches and the admittance of admittance element Y0. The switches may be implemented for example as MOS transistors with the gates being individually controlled from a programmable register. An admittance element may be a capacitor, inductor, resistor or a transistor.

The values of the admittance circuit 200 are determined according to the following criteria for a programmable admittance between 1 S and 5 S increasing by 5% of its value between sequential increments in admittance.

$$Y_{min}=1\ S$$

$$Y_{max}=5\ S$$

If $Y_I$ is the admittance of the Ith branch, then the value of each element in the circuit may be calculated by the following relationships:

$$Y_0=Y_{min}$$

For $I \geq 1$ $$Y_I = r^{(I-1)} * (r-1) * Y_0$$

Where r is the common ratio which Is determined by $Y_{k+1}/Y_k$. The circuit 200 is a stepwise variable admittance which steps according to a geometric progression. The ratio between each successive total admittance in the sequence $Y_{k-1}$, $Y_k$, $Y_{k+1}$ is a constant value which is the common ratio. The number of branches required may be determined from the expression $1 + \log(Y_{max}/Y_{min})/\log(r)$.

For example with targeted values: $Y_{min}=1$, $Y_{max}=5$, common ratio $r=1.05$ which is equivalent to a step of 5% requires 34 branches, each branch having the admittance value as indicated in the table below.

| I | $Y_I$ |
|---|---|
| 0 | 1.0000 |
| 1 | 0.0500 |
| 2 | 0.0525 |
| 3 | 0.0551 |
| 4 | 0.0579 |
| 5 | 0.0608 |
| 6 | 0.0638 |
| 7 | 0.0670 |
| 8 | 0.0704 |
| 9 | 0.0739 |
| 10 | 0.0776 |
| 11 | 0.0814 |
| 12 | 0.0855 |
| 13 | 0.0898 |
| 14 | 0.0943 |
| 15 | 0.0990 |
| 16 | 0.1039 |
| 17 | 0.1091 |
| 18 | 0.1146 |
| 19 | 0.1203 |
| 20 | 0.1263 |
| 21 | 0.1327 |
| 22 | 0.1393 |
| 23 | 0.1463 |
| 24 | 0.1536 |
| 25 | 0.1613 |
| 26 | 0.1693 |
| 27 | 0.1778 |
| 28 | 0.1867 |
| 29 | 0.1960 |
| 30 | 0.2058 |
| 31 | 0.2161 |
| 32 | 0.2269 |
| 33 | 0.2382 |

To control the circuit the command code is $2^n-1$ with $n=0$ to N, N being the number of branches in the circuit 200, i.e. a sequence 0,1,3,7,15, etc. This means that only one branch is switched for each sequential step in admittance value.

Compared to the binary circuit 100, the thermometric circuit 200 requires many more branches to implement the circuit and so requires a wider command bus and more individual components. However, it does allow a single transition between state changes and is less intolerant of differences in matching between components of the circuit.

Figure 3:
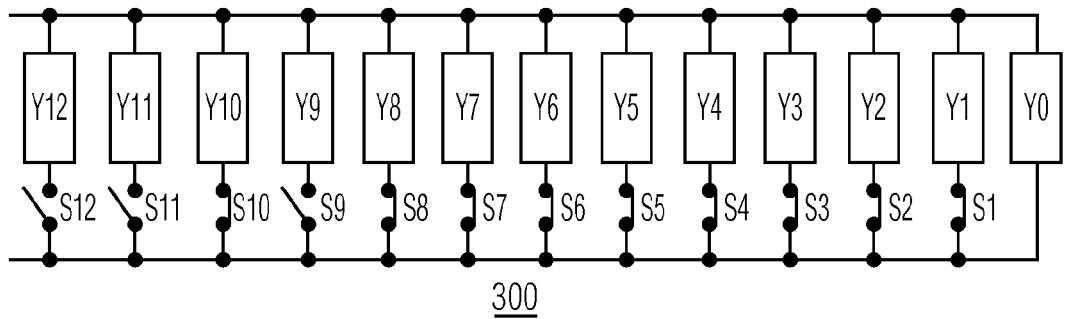
FIG. 3 illustrates a variable differential thermometric admittance circuit according to an embodiment.

FIG. 3 shows differential thermometric admittance circuit 300 having 13 branches connected in parallel. A first branch may have admittance element Y0 which always contributes to the total admittance of the admittance circuit 300. A second branch consists of a series arrangement of an admittance element Y1 and a switch S1. The admittance element Y1 contributes to the admittance value of the admittance circuit 300 when the switch S1 is closed or switched on. The other branches may also consist of a series arrangement of an admittance element and a switch. In operation the total admittance value of admittance circuit 300 is the sum of the switched on or selected branches and the admittance of admittance element Y0. The switches may be implemented for example as MOS transistors with the gates being individually controlled from a programmable register. An admittance element may be a capacitor, inductor, resistor or a transistor.

The values of the differential thermometric admittance circuit 300 may be determined according to the following criteria for a programmable admittance between 1 S and 5 S increasing by an increment of a maximum of 5%

$$Y_{min}=1\ S$$

$$Y_{max}=5\ S$$

if $Y_I$ is the admittance of the Ith branch, then the value of each element in the circuit may be calculated by the following relationships.

$$YI = r^{I-1} * (r-1) * Y0$$

Where I is the branch number, r is the common ratio, and Y0 is the initial value given by the relationship:

$$Y_0 = Y_{min}/r$$

The common ratio r is chosen in order to achieve $Y3 \approx Y1+Y2$ or $Y4 \approx Y1+Y2$ or $Y5 \approx Y1+Y2$. For example if common ratio is chosen such that $Y3 \approx Y1+Y2$, then the rank i of the circuit is three.

In general for a circuit of rank i, where r is chosen such that $Y_i = Y_1 + Y_2$, then consequently $Y_I = Y_{I-i+1} + Y_{I-i+2}$. For this relationship to be correct, then $$r^{i-1} \times (r-1) \times Y0 \approx (r-1) \times Y0 + r \times (r-1) \times Y0$$

i.e. $r^{i-1} \approx 1+r$     (Equation 1)

Possible solutions of equation 1 are in the following table

| i | r | r^(i − 1) | 1 + r |
|---|---|---|---|
| 3 | 1.618 | 2.618 | 2.618 |
| 4 | 1.325 | 2.325 | 2.325 |
| 5 | 1.221 | 2.221 | 2.221 |
| 6 | 1.167 | 2.167 | 2.167 |

The common ratio of the set of admittances may be 1.618, 1.325, 1,221, 1.167 or any other value fitting with equation 1. It is not necessary to use these values with a high accuracy since approximate values are also possible, at the expense of a shift of step values.

In case of command cycles for stepwise variable admittance circuits of rank 3 (i=3), the common ratio r may be chosen such that $0.8*Y3<Y1+Y2<1.05*Y3$ giving values of r in the range of $1,582<r<1.906$. In case of command cycles for stepwise variable admittance circuits of rank 4 (i=4), the common ratio r may be chosen such that $0.8*Y4<Y1+Y2<1.05*Y4$ giving values of r in the range of $1.298<r<1.452$. In case of command cycles for stepwise variable admittance circuits of rank 5 (i=5), the common ratio r may be chosen in a way that $0.85*Y5<Y1+Y2<1.05*Y5$ giving values of r in the range of $1.204<r<1.28$. In case of command cycles for stepwise variable admittance circuits of rank 6 (i=6), the common ratio r may be chosen such that $0.85*Y6<Y1+Y2<1.05*Y6$ giving values of r in the range of $1.155<r<1.211$. In case of command cycles for stepwise variable admittance circuits of rank 7 (i=7), the common ratio r may be chosen such that $0.9*Y7<Y1+Y2<1.05*Y7$ giving values of r in the range of $1.125<r<1.157$. For higher rank (i<7), the common ratio r may be chosen such that $0.9*Yi<Y1+Y2<1.05*Yi$.

Figure 4:
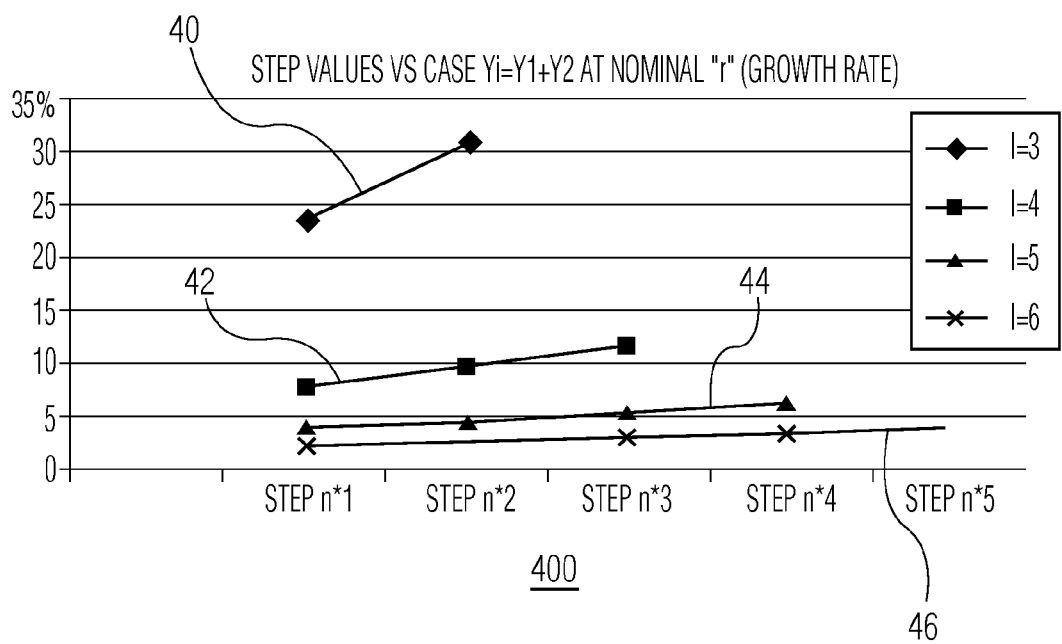
FIG. 4 shows a graph of admittance step size for differing circuit factors according to an embodiment.
Figure 5:
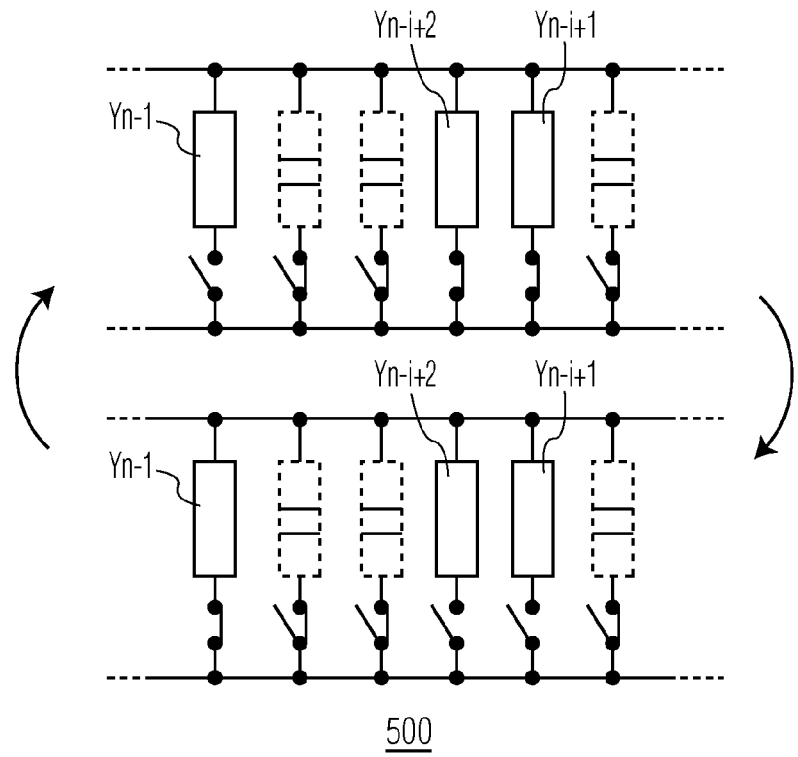
FIG. 5 shows the operation of a variable differential thermometric circuit admittance circuit according to an embodiment.

FIG. 4 illustrates the percentage variation of step size for different values of common ratio r for all the steps that may be realized for a number of different cases. For the case Y3=Y1+Y2 and common ratio r=1.618, the maximum step is 30.9 percent as shown on the graph line 40. For the case Y4=Y1+Y2 and common ratio r=1.325, the maximum step is 11.8 percent as shown on the graph line 42. For case Y5=Y1+Y2 and common ratio r=1.221 the maximum step is 6.3 percent as shown on the graph line 44. For case Y6=Y1+Y2 and common ratio r=1.167, the maximum step is 4 percent as shown on the graph line 46.

With targeted values: Ymin=1, Ymax=5, Step<1.05 (5%), a maximum step of 5% leads to choice of case Y6=Y1+Y2. This result in a choice of r=1.167, and branch number value of 11.42 rounded up to 12 so there may be 13 branches including Y0 since the minimum value $Y_{min}$ is implemented by two admittance elements.

Programmable differential thermometric admittance circuit 300 may have the following values

| | 0.857 |
|---|---|
| y1 | 0.143 |
| y2 | 0.167 |
| y3 | 0.195 |
| y4 | 0.227 |
| y5 | 0.265 |
| y6 | 0.310 |
| y7 | 0.361 |
| y8 | 0.422 |
| y9 | 0.492 |
| y10 | 0.574 |
| y11 | 0.670 |
| y12 | 0.782 |

In operation, the differential thermometric admittance circuit 300 may increase admittance value by switching off a branch ($Y_{I-1}$) and switching on the next bigger branch ($Y_I$). Instead of only an addition ($+Y_I$), a combination of additions and a subtractions ($+Y_I-Y_{I-1}$) may be made using the regular formatted command codes for values of I>=1 as illustrated below. A full cycle of admittance values may be achieved by switching on branches I-i+1 and branch I-i+2 instead of branch I, i.e. $+Y_{I-i+1}+Y_{I-i+2}-Y_{I-1}$ instead of $+Y_I-Y_{I-1}$. The general code formatting is shown below for different selection of $Y_i$. The value n in the table is an integer which increases by 1 for each i−1 steps of admittance value where i is the rank of the circuit.

| N° | Y3 ≈ Y1 + Y2 | Y4 ≈ Y1 + Y2 | Y5 ≈ Y1 + Y2 | Y6 ≈ Y1 + Y2 |
|---|---|---|---|---|
| 1 | $2^n-1$ | $2^n-1$ | $2^n-1$ | $2^n-1$ |
| 2 | $2^n-1 + 2^{n-1}$ | $2^n-1 + 2^{n-1}$ | $2^n-1 + 2^{n-1}$ | $2^n-1 + 2^{n-1}$ |
| 3 | | $2^n-1 + 2^{n-1} + 2^n$ | $2^n-1 + 2^{n-1} + 2^n$ | $2^n-1 + 2^{n-1} + 2^n$ |
| 4 | | | $2^n-1 + 2^{n-1} + 2^{n+1}$ | $2^n-1 + 2^{n-1} + 2^{n+1}$ |
| 5 | | | | $2^n-1 + 2^{n-1} + 2^{n+1} + 2^{n+2}$ |

This results in the command values below

| Y3 ≈ Y1 + Y2 | Y4 ≈ Y1 + Y2 | Y5 ≈ Y1 + Y2 | Y6 ≈ Y1 + Y2 |
|---|---|---|---|
| 1 | 1 | 1 | 1 |
| 10 | 10 | 10 | 10 |
| 11 | 100 | 100 | 100 |
| 101 | 11 | 1000 | 1000 |
| 111 | 101 | 11 | 10000 |
| Etc . . . | 1001 | 101 | 11 |
| | 111 | 1001 | 101 |
| | Etc. . . | 10001 | 1001 |
| | | 111 | 10001 |
| | | Etc . . . | 10000 |
| | | | 111 |
| | | | Etc . . . |

The table below is an example sequence of the codes used to operate programmable thermometric differential admittance circuit 300. The programmable admittance circuit may operate using the following code sequence. When the least significant bit in the code is 1, then switch s1 is closed switching admittance element Y1 into the circuit. When the least significant bit in the code is 0, then switch s1 is open switching admittance Y1 out of the circuit or unselecting admittance Y1. When the next least significant bit in the code is 1, then switch s2 is closed switching admittance Y2 into the circuit or selecting admittance Y2. When the next least significant bit in the code is 0, then switch s2 is open switching admittance Y2 out of the circuit or unselecting admittance Y2. Since the value of common ratio is chosen to satisfy the relationship Y6=Y1+Y2, the code cycle repeats every five cycles since i−1=5 where i is the rank of the circuit.

| S12 | S11 | S10 | S9 | S8 | S7 | S6 | S5 | S4 | S3 | S2 | S1 | code | Y(code) | Step (%) |
|---|---|---|---|---|---|---|---|---|---|---|---|---|---|---|
| 0 | 0 | 0 | 0 | 0 | 0 | 0 | 0 | 0 | 0 | 0 | 1 | 1 | 1.00 | |
| 0 | 0 | 0 | 0 | 0 | 0 | 0 | 0 | 0 | 0 | 1 | 0 | 10 | 1.02 | 2.39 |
| 0 | 0 | 0 | 0 | 0 | 0 | 0 | 0 | 0 | 1 | 0 | 0 | 100 | 1.05 | 2.72 |
| 0 | 0 | 0 | 0 | 0 | 0 | 0 | 0 | 1 | 0 | 0 | 0 | 1000 | 1.08 | 3.09 |
| 0 | 0 | 0 | 0 | 0 | 0 | 0 | 1 | 0 | 0 | 0 | 0 | 10000 | 1.12 | 3.50 |
| 0 | 0 | 0 | 0 | 0 | 0 | 0 | 0 | 0 | 0 | 1 | 1 | 11 | 1.17 | 3.98 |
| 0 | 0 | 0 | 0 | 0 | 0 | 0 | 0 | 0 | 1 | 0 | 1 | 101 | 1.19 | 2.39 |
| 0 | 0 | 0 | 0 | 0 | 0 | 0 | 0 | 1 | 0 | 0 | 1 | 1001 | 1.23 | 2.72 |
| 0 | 0 | 0 | 0 | 0 | 0 | 0 | 1 | 0 | 0 | 0 | 1 | 10001 | 1.27 | 3.09 |
| 0 | 0 | 0 | 0 | 0 | 0 | 1 | 0 | 0 | 0 | 0 | 1 | 100001 | 1.31 | 3.50 |
| 0 | 0 | 0 | 0 | 0 | 0 | 0 | 0 | 0 | 1 | 1 | 1 | 111 | 1.36 | 3.98 |
| 0 | 0 | 0 | 0 | 0 | 0 | 0 | 0 | 1 | 0 | 1 | 1 | 1011 | 1.39 | 2.39 |
| 0 | 0 | 0 | 0 | 0 | 0 | 0 | 1 | 0 | 0 | 1 | 1 | 10011 | 1.43 | 2.72 |
| | | | | | | | | | | | | Etc . . . | . . . | . . . |

This may allow the admittance value to be incremented by switching three or less admittance elements for each increment. The resulting circuit has a maximum step $Y_k/Y_{k-1}$ between sequential total admittance values $Y_k$ and $Y_{k-1}$ which is less than the common ratio r.

Figure 6:
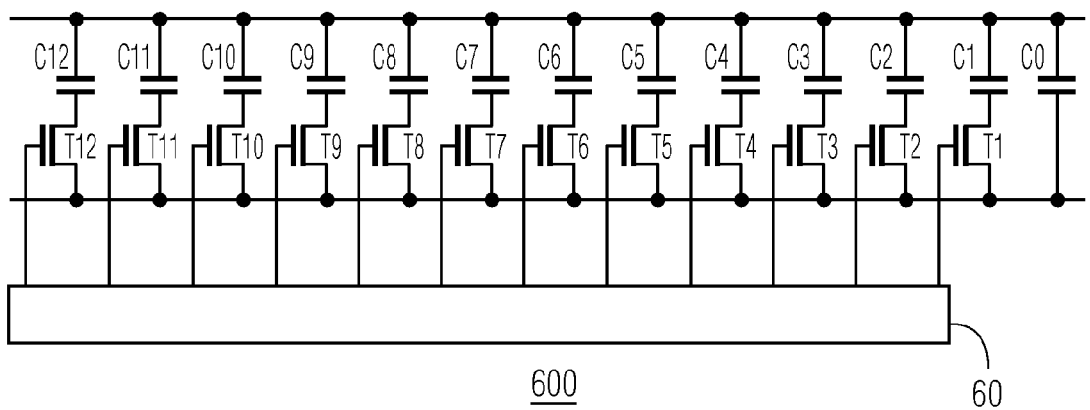
FIG. 6 illustrates a variable differential thermometric circuit implementing a tunable capacitor according to an embodiment.

FIG. 6 illustrates a 13 stage programmable differential thermometric admittance circuit 600 using capacitors is the admittance elements. Since capacitance is proportional to admittance for a fixed frequency, the capacitance values may be derived from the equations described herein. Programmable admittance circuit 800 has a first branch with a capacitor C0. A second branch arranged in parallel to the first branch may have of a series arrangement of a capacitor C1 connected to either a drain or source of and a MOS transistor T1. The gate of transistor T1 may be connected to a controller 60 which may be a software programmable register. The transistor T1 acts as a switch. The capacitor C1 contributes to the admittance value of the admittance circuit 600 when a voltage is applied to the gate of the transistor to switch the transistor on. The other eleven branches may also consist of a series arrangement of a capacitor and a transistor, in operation the total admittance value of admittance circuit 600 may be the sum of the admittance of the switched on branches and the admittance of capacitor C0.

The circuit is based on Y4 approximately equal to the sum of Y1 and Y2 and with a common ratio r of 1.35 giving a maximum theoretical step size of 11.3% percent between admittance values. The value of 1.35 chosen deviates from the calculated value of 1.325 so fewer branches are used in the implementation. This may give reduced parasitic effects at the expense of a slight increase in step size. However the step size between sequential admittance values will still be less than the common ratio r. Since capacitance values can be used as equivalent to admittance values, then capacitor C4 may be chosen to be approximately equal to the sum of the values of capacitor C2 and capacitor C1. Example possible values for all the capacitances of differential thermometric admittance circuit 600 are in the following table:

| | |
|---|---|
| C0 | 1238 fF |
| C1 | 433 fF |
| C2 | 585 fF |
| C3 | 790 fF |
| C4 | 1066 fF |
| C5 | 1439 fF |
| C6 | 1943 fF |
| C7 | 2623 fF |
| C8 | 3541 fF |
| C9 | 4780 fF |
| C10 | 6453 fF |

-continued

| | |
|---|---|
| C11 | 8712 fF |
| C12 | 11761 fF |

Figure 7:
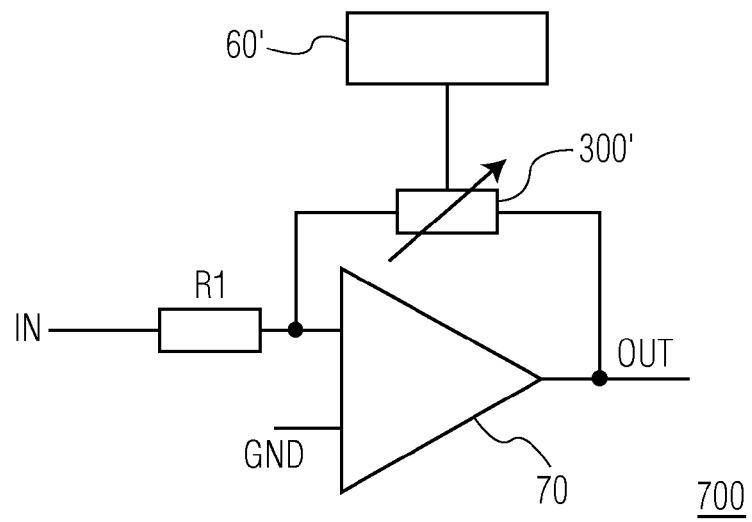
FIG. 7 shows a programmable gain amplifier according to an embodiment.

FIG. 7 shows a programmable gain amplifier 700 having an input connected to a terminal of resistor R1. A second terminal of resistor R1 may be coupled to a first input of amplifier 70 and a first terminal of a differential thermometric admittance circuit 300'. A second terminal of a differential thermometric admittance circuit 300" may be coupled to an output of the amplifier 70. A second input of amplifier 70 may be connected to a reference voltage which may be a ground potential. Control inputs of differential thermometric admittance circuit 300' may be connected to a controller 60'. The admittance elements in admittance circuit 300' may be resistors and the switches may be implemented as MOS transistors having the gates connected to the controller 60'. In operation the controller 60' may switch the switchable admittance elements to vary the gain of the variable gain amplifier 700 by incrementing or decrementing the admittance value according to one of the control sequences previously described. Controller 60' may be implemented as a software programmable register and the control sequence may be implemented in software. Alternatively the control sequence may be implemented using logic gates in hardware. The resistors may have a minimum value of 77 Ohms and a maximum value of 500 Ohms corresponding to an admittance varying between 2 mS and 13 mS. The programmable gain amplifier may have a gain varying in steps of less than 0.2 dB by incrementing or decrementing the admittance values.

Figure 8:
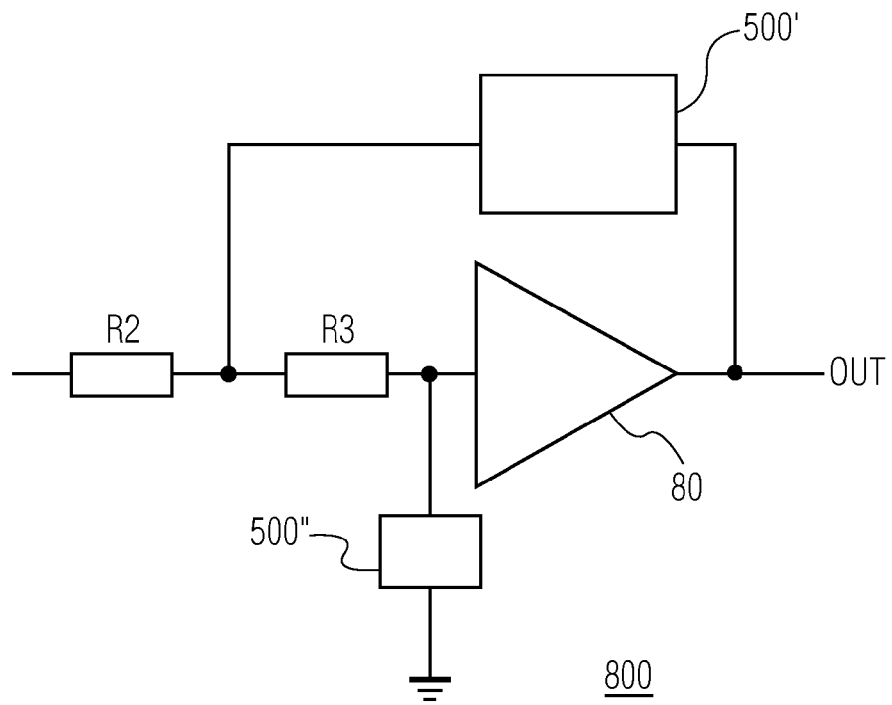
FIG. 8 illustrates a programmable low pass filter according to an embodiment.

FIG. 8 shows a programmable low pass filter 800. An input may be connected to a first terminal of resistor R2. A second terminal of resistor R2 may be connected to a first terminal of R3. A second terminal of R3 may be connected to an input of amplifier 80 and a first terminal of differential thermometric circuit 500". A second terminal of differential thermometric circuit 500' may be connected to a reference voltage which may be a ground. The second terminal of resistor R2 may be connected to first terminal of a differential thermometric circuit 500'. A second terminal of differential thermometric circuit 500" may be connected to an output of amplifier 80. The differential thermometric circuits 500' and 500" may use capacitors as admittance elements so can be used to adjust the frequency response characteristics of the filter.

Embodiments may include a programmable resistor, capacitor, inductor, current source or transconductance with a fine step and over a wide range. Other embodiments may include an arrangement of serial impedances having an equivalent circuit of the parallel admittance circuits described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A variable admittance circuit comprising a plurality of admittance elements arranged in parallel branches, the plurality of admittance elements comprising:
    a fixed admittance element having an admittance value $Y_0$,
    a sequence of at least three switchable admittance elements having respective admittance values $Y_1$ in a geometric sequence with a common ratio r and first value $Y_1$ given by $$Y_1 = Y_{min} * \left(\frac{r-1}{r}\right) = Y_0 * (r-1)$$

wherein the variable admittance circuit is operable to vary the total admittance between a minimum admittance value $Y_{min}$ and a maximum admittance value $Y_{max}$ in steps by switching the switchable admittance elements thereby selecting or unselecting the switchable admittance elements and wherein
    the common ratio is less than two and greater than a maximum step, and
    the at least three switchable admittance elements comprise a first switchable admittance element having an admittance value $Y_1$, a second switchable admittance element having an admittance value $Y_2$, and a further switchable admittance element of rank i having an admittance value of $K*(Y_1+Y_2)$, wherein K is a number in the range of 0.8 to 1.05.

2. The variable admittance of claim 1 wherein for a branch 1 having a value greater than rank i, the admittance of admittance element $Y_1$ is $K* (Y_{I-i+1}+Y_{I-i+2})$ and wherein the variable admittance circuit is operable to increase the total admittance by a value of $Y_1-Y_{I-1}$ by unselecting switchable admittance element $Y_{I-1}$, selecting switchable admittance element $Y_{I-i+1}$ and selecting switchable admittance element $Y_{I-i+2}$.

3. The variable admittance circuit of claim 1, further comprising a controller coupled to each of the switchable admittance elements, the controller configured to vary the total admittance between the minimum admittance value $Y_{min}$ and the maximum admittance value $Y_{max}$ by switching a maximum of three switchable admittance elements.

4. The variable admittance circuit of claim 1, wherein the number of parallel branches is greater than or equal to $2+\log(Y_{max}/Y_{min})/\log(r)$.

5. The variable admittance circuit of claim 1, wherein at least one of the admittance elements comprises a capacitor.

6. The variable admittance circuit of claim 1, wherein at least one of the admittance elements comprises a resistor.

7. The variable admittance circuit of claim 1, wherein at least one of the admittance elements comprises an inductor.

8. The variable admittance circuit of claim 1, wherein at least one of the admittance elements comprises a transistor.

9. The variable admittance circuit of claim 1, wherein the switchable admittance element comprises:
    a transistor having a control terminal, a first transistor terminal and a second transistor terminal,
    an admittance element having a first terminal coupled to the first transistor terminal and a further terminal, wherein the switchable admittance element is operable to be switched by applying a control voltage to the transistor control terminal.

10. A filter comprising an operational amplifier coupled to the variable admittance circuit of claim 1.

11. A programmable amplifier comprising an operational amplifier coupled to the variable admittance circuit of claim 1.

12. A radio frequency tuner circuit comprising the variable admittance circuit of claim 1.

13. A silicon tuner comprising the variable admittance circuit of claim 1.

14. A method of altering the admittance of a variable admittance circuit, the variable admittance circuit comprising a plurality of admittance elements arranged in parallel branches, the plurality of admittance elements comprising a fixed admittance element having an admittance value $Y_0$, and a sequence of at least three switchable admittance elements having respective admittance values $Y_1$ where 1 is an integer, the method comprising the steps for branches where 1 is greater than or equal to a predetermined ranking integer value i of:
    selecting a branch with admittance value $Y_{I-1}$, and
    increasing the total admittance by a value of less than $Y_{I+1}-Y_{I-1}$ by (1) for the case where branches having a value of and $Y_{I-i+1}$ and $Y_{I-i+2}$ are unselected, unselecting switchable admittance element having a value $Y_{I-1}$, selecting switchable admittance element having a value $Y_{I-i+1}$ and selecting switchable admittance element having a value $Y_{I-i+2}$ and (2) for the case where branches having a value of and $Y_{I-i+1}$ and $Y_{I-i+2}$ are already selected, unselecting switchable admittance element having a value $Y_{I-1}$ and selecting switchable admittance element having a value $Y_1$.

* * * * *